(12) United States Patent
Stewart et al.

(10) Patent No.: US 6,825,789 B1
(45) Date of Patent: Nov. 30, 2004

(54) DUAL PATH ANALOG-TO-DIGITAL CONVERSION METHOD AND SYSTEM

(75) Inventors: Brian Stewart, South Burlington, VT (US); Ronald L. Swerlein, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/858,042

(22) Filed: Jun. 1, 2004

Related U.S. Application Data

(63) Continuation of application No. 10/718,066, filed on Nov. 20, 2003, now Pat. No. 6,778,125.

(51) Int. Cl.[7] .............................................. H03M 1/12
(52) U.S. Cl. ........................ 341/155; 341/118; 341/128
(58) Field of Search ................................ 341/110, 118, 341/120, 128, 129, 143, 155, 159, 167, 168

(56) References Cited

U.S. PATENT DOCUMENTS

| | | | | |
|---|---|---|---|---|
| 5,079,510 A | * | 1/1992 | Komatsu et al. | 324/142 |
| 5,164,726 A | * | 11/1992 | Bernstein et al. | 341/120 |
| 5,250,948 A | * | 10/1993 | Berstein et al. | 341/131 |
| 5,563,596 A | * | 10/1996 | Snyder et al. | 341/131 |
| 6,265,999 B1 | * | 7/2001 | Prucnal | 341/137 |
| 6,313,772 B1 | * | 11/2001 | McNeely | 341/143 |
| 6,340,943 B1 | * | 1/2002 | Chow et al. | 341/161 |
| 6,342,850 B1 | * | 1/2002 | Borer et al. | 341/156 |
| 6,417,792 B1 | * | 7/2002 | King et al. | 341/143 |
| 6,433,723 B1 | * | 8/2002 | Randall | 341/155 |
| 6,473,013 B1 | * | 10/2002 | Velazquez et al. | 341/120 |
| 6,509,852 B1 | * | 1/2003 | Todsen et al. | 341/120 |
| 6,662,367 B2 | * | 12/2003 | Dapper et al. | 725/105 |

\* cited by examiner

*Primary Examiner*—Michael Tokar
*Assistant Examiner*—Linh V Nguyen

(57) ABSTRACT

A dual path analog-to-digital conversion method and system. The system includes a first and second circuits. The first and second circuits each convert an input analog signal into digital signals at differing sample rates. The circuit having the slower sampling rate aliases frequency components of the input analog signal that are higher than half that sampling rate. Frequency components causing the aliasing in the slower sampling circuit are replicated from the faster sampling circuit at the appropriate amplitude, folded into the aliased frequency, and subtracted from the output of the slower sampling circuit. The outputs of both sampling circuits are then merged. These techniques extend the bandwidth of the slower conversion system without degrading the low-frequency accuracy of the slower conversion system.

10 Claims, 13 Drawing Sheets

DUAL PATH ANALOG-TO-DIGITAL CONVERSION METHOD AND SYSTEM

This is a Continuation of application Ser. No. 10/718,066 filed on 20 Nov. 2003 now U.S. Pat. No. 6,778,125, the entire disclosure of which is herein incorporated by reference.

BACKGROUND

An important function in modern signal processing is that of converting an analog signal into a digital representation. This function is accomplished by sampling the analog signal at periodic intervals and then quantizing the value of the time sampled analog signal into discrete values. A more accurate digital representation is obtained by taking more samples over a given amount of time, which implies a faster sampling rate or sampling frequency $f_S$.

Any signal having a frequency component $f_C$ that is greater than half the sampling frequency will be corrupted during the sampling process. The distortion of signals having frequency components $f_C$ greater than half the sampling frequency (i.e., at $f_S/2$) is called aliasing. Aliasing is an inherent sampling phenomenon and results in frequency components above half the sampling frequency being converted into frequency components below half the sampling frequency according to the equation $f_A=(f_S-f_C)$. Aliasing does not change frequency, components less than half the sampling frequency. Aliasing is typically reduced by filtering out frequencies at and above half the sampling frequency ($f_S/2$) before sampling. This avoids corrupting low frequency content with aliased high frequency content at the expense of losing the high frequency information.

Fundamental analog issues such as settling time present another problem in the digitization of an analog signal. For any given digitization system, the accuracy requirement placed on the design limits the maximum sampling rate and thus the non-aliasing bandwidth of the system. Different digitization technologies will exhibit different accuracy vs. sampling rate curves, but an inverse relationship always exists between accuracy and sampling rate. If greater accuracy is desired, the design will be limited to a smaller bandwidth. In other words, a faster digitization system (greater bandwidth) will be limited to less accuracy than will be a slower digitization system (less bandwidth) for a given conversion technology.

In the common measurement application of signal power estimation, the measurement bandwidth of the analog-to-digital converter (ADC) places a limit on the over-all system bandwidth. In this application a need typically exists for higher accuracy at lower frequencies. For power estimation, there are two typical approaches for measuring signals that exceed the raw system ADC bandwidth. The first solution uses some type of analog RMS converter such as a log-antilog IC or a thermal transducer to convert the input signal into a low bandwidth signal whose value is proportional to the input signal power. This system can be expensive, is limited by the converter accuracy, and cannot measure signal characteristics such as maximum or minimum. The second method requires the input to be periodic and uses a track-and-hold circuit with a synchronous triggering system and a high accuracy analog-to-digital converter to sub-sample the input signal. While this solution can be very accurate, it is strictly limited to periodic inputs and is both costly and complex.

For general digitizing applications wherein the system analog-to-digital converter cannot simultaneously meet the necessary bandwidth and accuracy, there are also two common techniques in use. The first solution uses two analog-to-digital converters. The sampled signal stream of either one or the other is used depending on the system configuration. This solution can be expensive and forces an explicit mode change that generally introduces a discontinuity in the trade-off between reading rate and accuracy. The second solution uses a sub-sampling system similar to that used in power estimation and suffers from the same set of drawbacks.

SUMMARY

In representative embodiments, a dual path analog-to-digital conversion method and system is described. The system includes a first and second circuits. The first and second circuits each convert an input analog signal into digital signals at differing sample rates. The circuit having the slower sampling rate aliases frequency components of the input analog signal that are higher than twice that sampling rate. Frequency components that are aliased in the slower sampling circuit are replicated from the faster sampling circuit at the appropriate amplitude, intentionally folded into the aliased frequency via a down-sampling operation, and subtracted from the output of the slower sampling circuit. The outputs of both sampling circuits are then merged.

The overall sampling rate of a given low-frequency analog-to-digital system can be increased without reducing the low frequency accuracy. In representative embodiments, a second, faster analog-to-digital converter is added to a first, slower converter. The faster converter has a lower accuracy than that of the slower converter but has a higher sampling rate. The two sample data streams are then merged. The resulting dual path analog-to-digital converter has an increased sampling rate but the same low frequency accuracy as the slower analog-to-digital converter.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations that will be used to more fully describe the invention and can be used by those skilled in the art to better understand it and its inherent advantages. In these drawings, like reference numerals identify corresponding elements.

DETAILED DESCRIPTION

Figure 1:
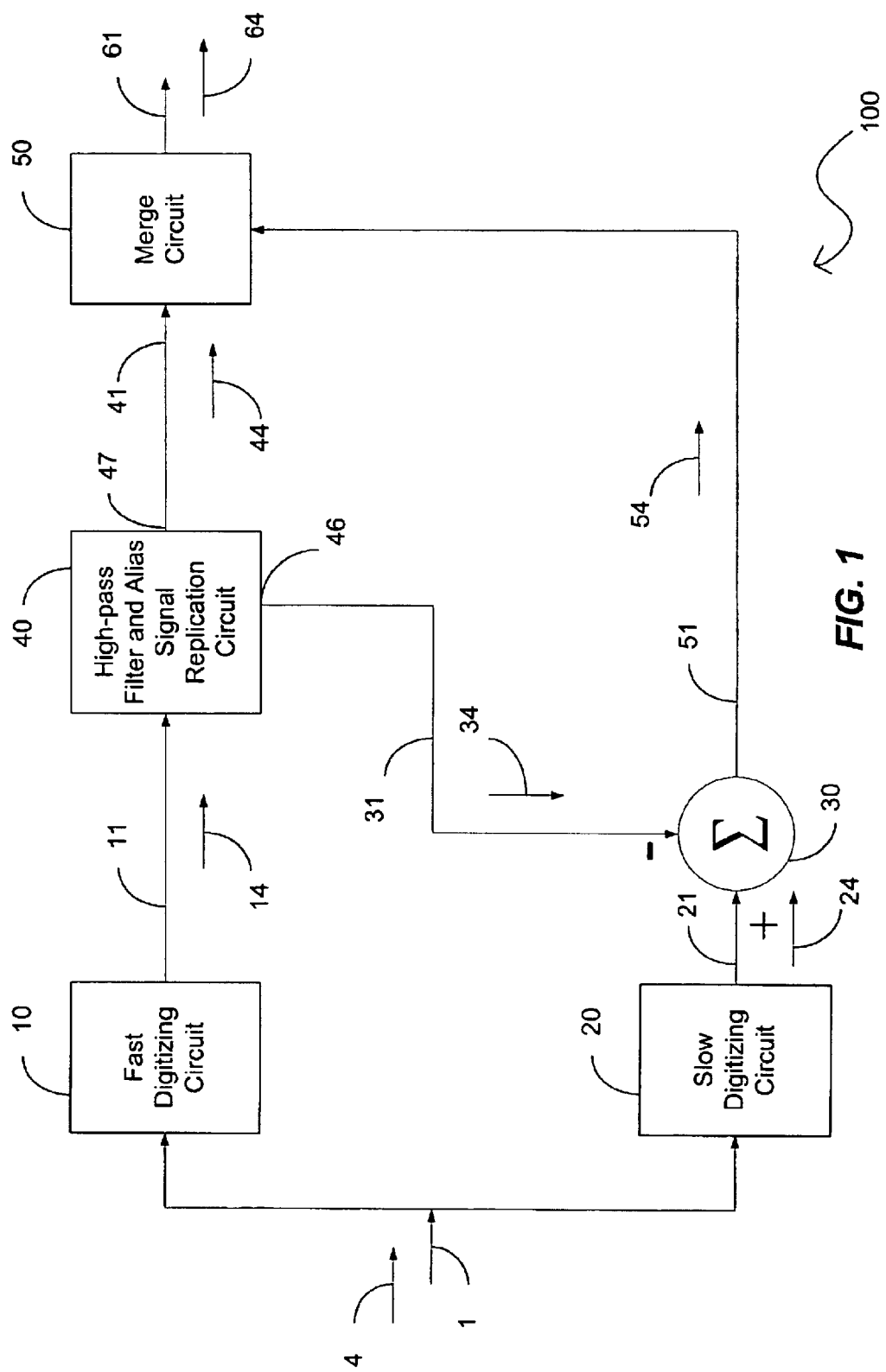
FIG. 1 is a drawing of a signal processing system as described in various representative embodiments consistent with the teachings of the invention.

As shown in the drawings for purposes of illustration, representative embodiments disclosed herein relate to novel techniques for increasing the bandwidth of an analog-to-digital system while maintaining a given level of accuracy at the lower frequencies. These techniques find application in the following two types of measurements: (1) signal power estimation and (2) waveform digitization. In many implementations of such measurement systems, the measurement bandwidth of the analog-to-digital converter limits the total system bandwidth. There is often a need to increase the measurement bandwidth without reducing low frequency measurement accuracy.

In the following detailed description and in the several figures of the drawings, like elements are identified with like reference numerals.

As will be shown in the following, the overall sampling rate of a given low-frequency analog-to-digital system can be increased without reducing the low frequency accuracy. In representative embodiments, a second, faster analog-to-digital converter is added to a first, slower converter. The faster converter has a lower accuracy than that of the slower converter but has a higher sampling rate. The two sample data streams are then merged. The resulting dual path analog-to-digital converter has an increased overall sampling rate but the same low frequency accuracy as the slower analog-to-digital converter.

Implementations of embodiments described herein can solve a number of measurement problems that require higher accuracy at lower frequencies. In power measurement and digitizing problems, the dual path analog-to-digital conversion techniques described herein can directly and continuously measure the input signal. The dual path system can be less expensive, less complex, and contain fewer inherent limitations than previous systems.

FIG. 1 is a drawing of a signal processing system 100 as described in various representative embodiments consistent with the teachings of the invention. In FIG. 1, the system 100 comprises a fast digitizing circuit 10, also referred to herein as a fast circuit 10 and as a first circuit 10, a slow digitizing circuit 20, also referred to herein as a slow circuit 20 and as a second circuit 20, a subtraction circuit 30, also referred to herein as a subtracter 30, a high-pass filter and alias signal replication circuit 40, also referred to herein as an anti-aliasing circuit 40, and a merge circuit 50.

An input to the fast digitizing circuit 10 is connected to an input to the slow digitizing circuit 20 at system input 1. An output of the fast digitizing circuit 10 is connected to an input to the high-pass filter and alias signal replication circuit 40 via a first connection path 11. An output of the slow digitizing circuit 20 is connected to an input to the subtraction circuit 30 via a second connection path 21. The anti-aliasing circuit 40 has a first output 46 and a second output 47. The first output 46 is connected to another input of the subtraction circuit 30 via third connection path 31, and the second output 47 is connected to an input of the merge circuit 50 via fourth connection path 41. The output of the subtraction circuit 30 is connected to another input of the merge circuit 50 via fifth connection path 51.

An input analog signal 4 is detected by the system at system input 1. First connection path 11 transfers a first digital signal 14 from the output of the fast digitizing circuit 10 to the input of the anti-aliasing circuit 40. Second connection path 21 transfers a second digital signal 24 from the output of the slow digitizing circuit 20 to one of the inputs of the subtraction circuit 30. Third connection path 31 transfers aliased component approximations 34 from the first output 46 of the anti-aliasing circuit 40 to the other input of the subtraction circuit 30. Fourth connection path 41 transfers high-pass filtered first digital signal 44 from the second output 47 of the anti-aliasing circuit 40 to one of the inputs of the merge circuit 50. Fifth connection path 51 transfers de-aliased digital signal 54 from the output of the subtraction circuit 30 to the other input of the merge circuit 50.

An analog input signal 4 inputted to both the fast and slow digitizing circuits 10,20 at the system input 1 is converted by both digitizing circuits 10,20 into digital signals. The fast digitizing circuit 10 has a first sampling rate (a fast sampling rate) that is greater than the sampling rate, referred to herein as a second sampling rate (a slow sampling rate), of the slow digitizing circuit 20. The slow digitizing circuit 20 has a better low-frequency accuracy than that of the fast digitizing circuit 10. For illustrative purposes, it is assumed that both the fast and the slow digitizing circuits 10,20 have ideal frequency responses in their respective non-aliasing pass bands. If the input analog signal 4 includes a component, referred to herein as a first component, whose frequency is less than half the first sampling rate and greater than half of the second sampling rate, an aliased component signal will be generated in the output of the slow digitizing circuit 20 but not in the output of the fast digitizing circuit 10. In a representative example, both the fast digitizing circuit 10 and the slow digitizing circuit 20 are assumed to be approximately linear and close to unity in system transfer function. The high-pass filter and alias signal replication circuit 40 replicates that aliased component and passes it to the subtraction circuit 30. By subtracting the aliased component from the output of the slow digitizing circuit 20, the output of the subtraction circuit 30 replicates the output of the slow digitizing circuit 20 without the aliased signal resultant from the interaction of the sampling rate of the slow digitizing circuit 20 and the first component. The high-pass filter and alias signal replication circuit 40 further filters out the low-frequency components from the output of the fast digitizing circuit 10 and passes those onto the merge circuit 50 where these high-frequency components are merged with the low frequency components less the aliasing signals from the slow digitizing circuit 20.

Idealized representations of signal amplitudes at various points in the system resultant from the input analog signal 4 are shown in FIGS. 2A–2G. The following notational conventions will be used herein: (1) f=frequency, (2) $f_{FS}$=the first sampling rate (the fast sampling rate; the sampling rate of the fast digitizing circuit 10), (3) $f_{SS}$=the second sampling rate (the slow sampling rate; the sampling rate of the slow digitizing circuit 20), (4) $f_{IS}$=the intermediate sampling frequency which is the output data rate from the merge circuit 50, (5) $f_0$=a frequency passed by both the fast digitizing circuit 10 and the slow digitizing circuit 20, (6) $f_1$=a frequency passed by the fast digitizing circuit 10 and aliased by the slow digitizing circuit 20, (7) $f_A$=the aliased frequency of $f_1$ in the slow path caused by the slower sampling rate of the slow digitizing circuit 20, (8) I(f)=the amplitude of the input analog signal 4 at frequency f, (9) $I_0$=I($f_0$)=the amplitude of the input analog signal at frequency $f_0$, and (10) $I_1$=I($f_1$)=the amplitude of the input analog signal at frequency $f_1$.

Figure 2A:
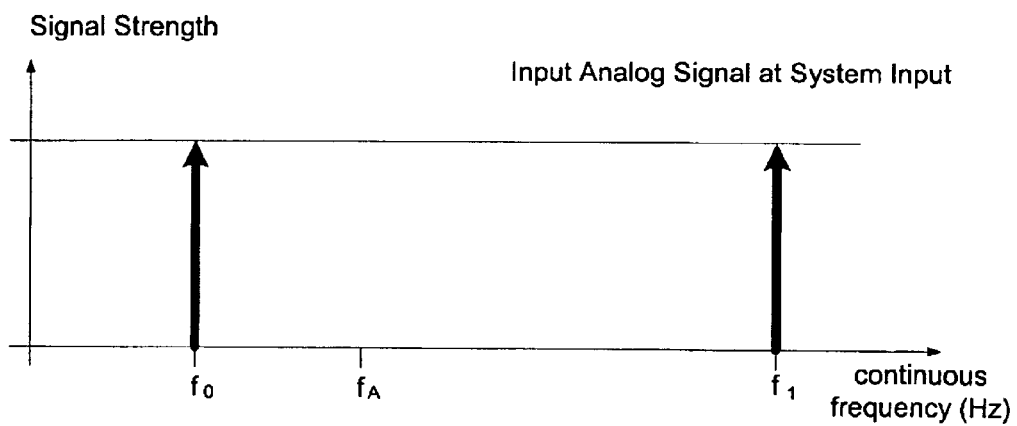
FIG. 2A is a plot of signal amplitude vs. frequency at the system input of FIG. 1.

FIG. 2A is a plot of signal amplitude vs. frequency at the system input 1 of FIG. 1. In the example of FIG. 2A, the input analog signal 4 comprises a high-frequency component $I_1$ at frequency $f_1$ and a low-frequency component $I_0$ at frequency $f_0$. As the relative signal amplitudes shown in FIGS. 2A–2G are signal level and implementation dependent, these figures are for illustrative purposes only. They may be more readily understood in terms of the implementations of FIGS. 3 and 4.

Figure 2B:
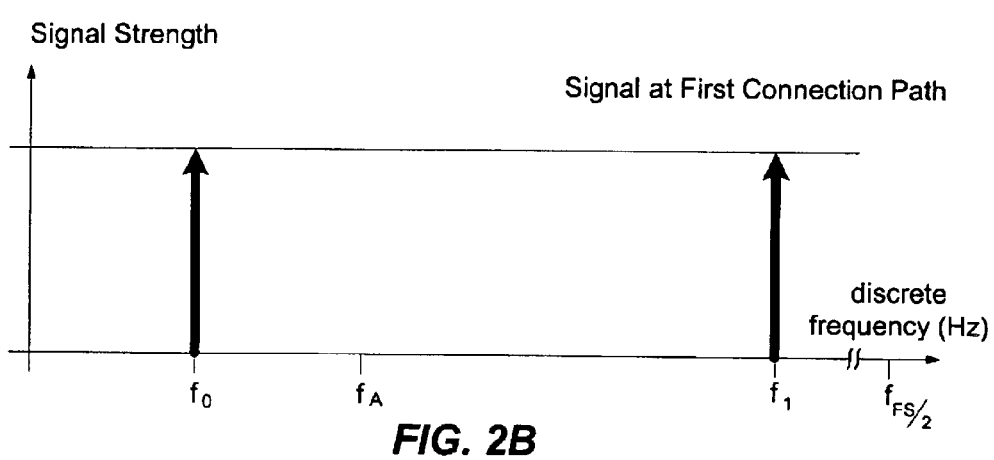
FIG. 2B is a plot of signal amplitude vs. frequency at first connection path of FIG. 1.

FIG. 2B is a plot of signal amplitude vs. frequency at first connection path 11 of FIG. 1. In the example of FIG. 2B, the first digital signal 14 comprises a digitized high-frequency component $I_1$ at frequency $f_1$ and a low-frequency component $I_0$ at frequency $f_0$. The sampling rate of the fast digitizing circuit 10 is fast enough to replicate both frequency components of the input analog signal 4.

Figure 2C:
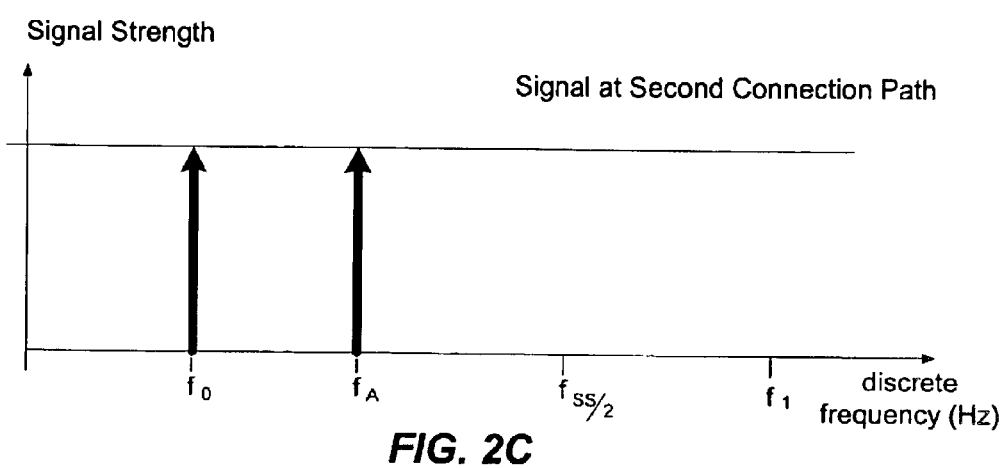
FIG. 2C is a plot of signal amplitude vs. frequency at second connection path of FIG. 1.

FIG. 2C is a plot of signal amplitude vs. frequency at second connection path 21 of FIG. 1. In the example of FIG. 2C, the second digital signal 24 comprises a digitized low-frequency component $I_0$ at frequency $f_0$ and an aliased signal of the high-frequency component 1, at frequency $f_A$. The aliasing of the high-frequency signal component $I_1$ to frequency $f_A$ is caused by the fact that the sampling rate of the slow digitizing circuit 20 is less than twice the frequency of the high-frequency component $I_1$ of the input analog signal 4. Note that the high-frequency component $I_1$ is aliased by the slow digitizing circuit 20 but is not aliased by the fast digitizing circuit 10.

Figure 2D:
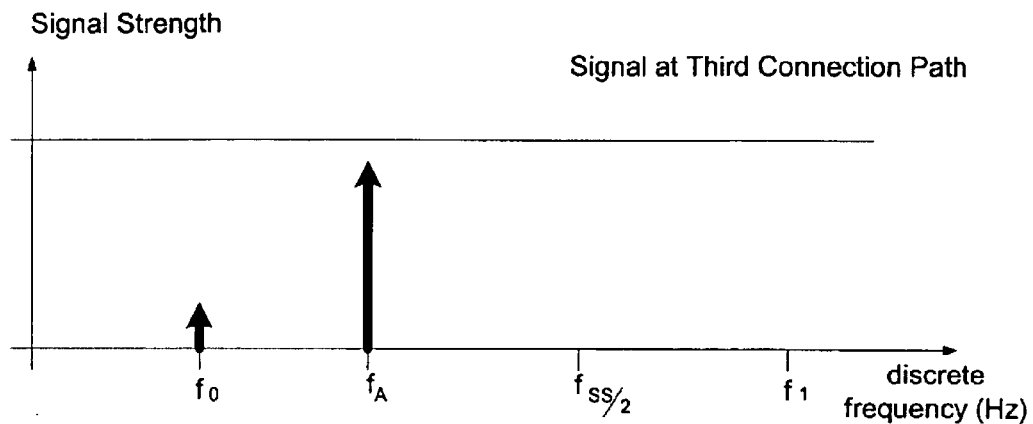
FIG. 2D is a plot of signal amplitude vs. frequency at third connection path of FIG. 1.

FIG. 2D is a plot of signal amplitude vs. frequency at third connection path 31 of FIG. 1. In the example of FIG. 2D, the aliased component approximation 34 comprises a replication of the aliased signal of the high-frequency component $I_1$ of the input analog signal created by the low sampling rate of the slow digitizing circuit 20 at frequency $f_A$. A residual term remains at frequency $f_0$ due to less than ideal low frequency rejection in the high pass filter. The change in amplitude from $I_1$ of the component at frequency $f_A$ is due to the less than ideal high frequency gain in the high pass filter.

Figure 2E:
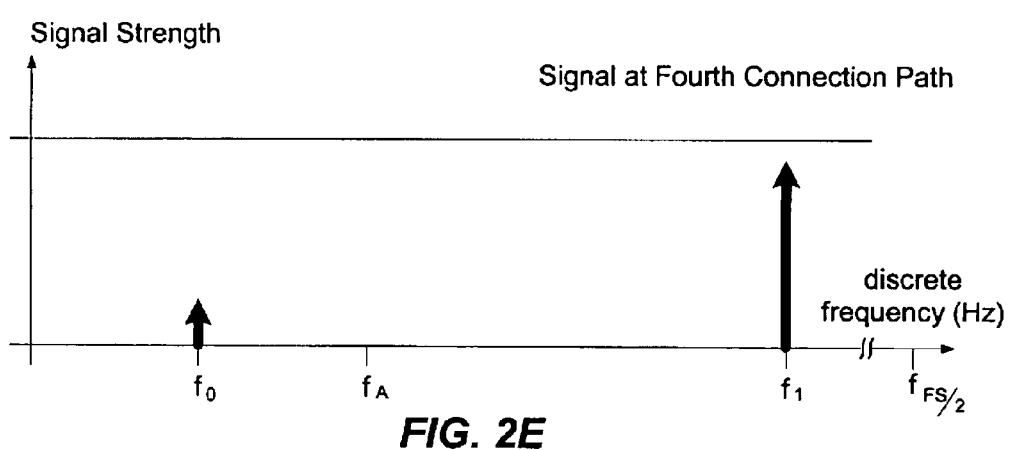
FIG. 2E is a plot of signal amplitude vs. frequency at fourth connection path of FIG. 1.

FIG. 2E is a plot of signal amplitude vs. frequency at fourth connection path 41 of FIG. 1. In the representative example of FIG. 2E, the high-pass filtered first digital signal 44 comprises the high-frequency component $I_1$ at frequency $f_1$ of the input analog signal 4 with near unity gain and the low-frequency component $I_0$ at frequency $f_0$ of the input analog signal 4 with near zero gain.

Figure 2F:
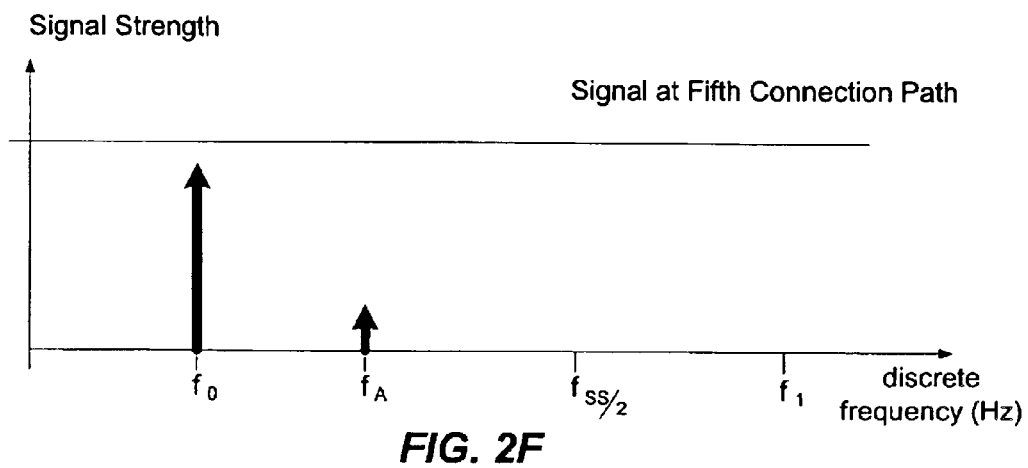
FIG. 2F is a plot of signal amplitude vs. frequency at fifth connection path of FIG. 1.

FIG. 2F is a plot of signal amplitude vs. frequency at fifth connection path 51 of FIG. 1. In the representative example of FIG. 2F, the de-aliased digital signal 54 comprises the low-frequency component $I_0$ at frequency $f_0$ of the input analog signal 4 with near unity gain and the aliased form at frequency $f_A$ of component $I_1$ of the input analog signal 4 with near zero gain. In effect, FIG. 2F is a composite of the signal of FIG. 2D subtracted from the signals of FIG. 2C.

Figure 2G:
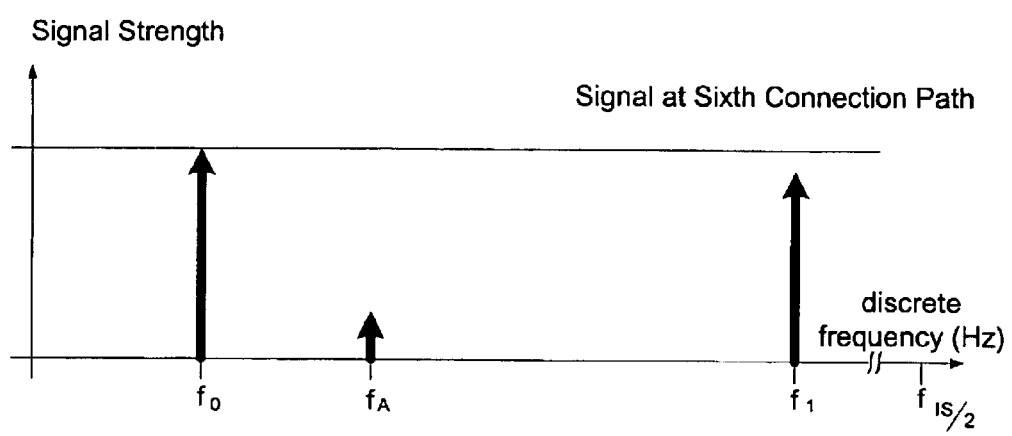
FIG. 2G is a plot of signal amplitude vs. frequency at sixth connection path of FIG. 1.

FIG. 2G is a plot of signal amplitude vs. frequency at sixth connection path 61 of FIG. 1. The sixth connection path 61 is also referred to herein as the system output 61. In the example of FIG. 2G, an output signal 64 comprises a merging of the high-pass filtered first digital signal 44 and de-aliased digital signal 54. In effect, FIG. 2G is a composite of the signals of FIG. 2E and the signals of FIG. 2F. In the representative example, the amplitudes at $f_0$, $f_A$, and $f_1$ are respectively 1 with unity gain, $I_1$ with near zero gain, and $I_1$ with near unity gain. Thus, the output signal 64 is a digitized version of the input analog signal having been largely compensated for the aliased signal created due to the sampling rate of the slow digitizing circuit 20 with correct amplitude at low frequency and nearly correct amplitude at high frequency.

Figure 3:
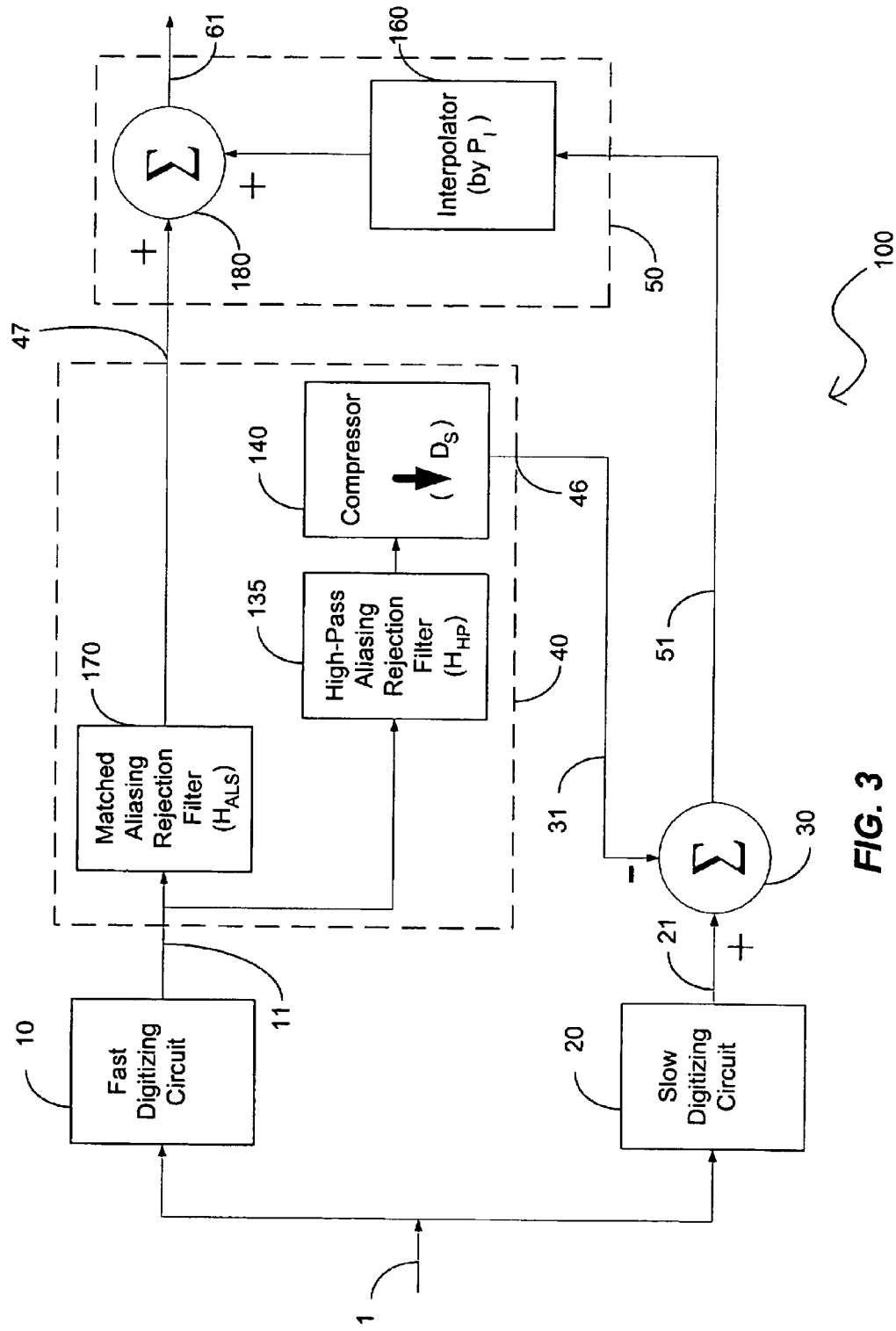
FIG. 3 is a drawing of another signal processing system as described in various representative embodiments consistent with the teachings of the invention.

FIG. 3 is a drawing of another signal processing system 100 as described in various representative embodiments consistent with the teachings of the invention. In FIG. 3, the high-pass filter and alias signal replication circuit 40 comprises a matched aliasing rejection filter 170, also referred to herein as a first high-pass filter 170, a high-pass aliasing rejection filter 135, also referred to herein as a second high-pass filter 135, and a compressor 140. The inputs of the matched aliasing rejection filter 170 and the high-pass aliasing rejection filter 135 are connected to the input of the high-pass filter and alias signal replication circuit 40. The output of the matched aliasing rejection filter 170 is connected to the second output 47 of the high-pass filter and alias signal replication circuit 40. The output of the high-pass aliasing rejection filter 135 is connected to the input of the compressor 140. The output of the compressor 140 is connected to the first output 46 of the high-pass filter and alias signal replication circuit 40. The pass-band of the first high-pass filter 170 passes frequencies greater than a preselected frequency less than half the second sampling rate, and the pass-band of the second high-pass filter 135 passes frequencies greater than another preselected frequency less than half the second sampling rate. In some representative implementations, both preselected frequencies are the same.

Also in FIG. 3, the merge circuit 50 comprises an interpolator 160 and a summation circuit 180. One of the inputs to the summation circuit 180 is connected to the input of the merge circuit 50 which is connected to the second output 47, and the other input to the summation circuit 180 is connected to the output of the interpolator 160. The input of the interpolator 160 is connected to the input of the merge circuit 50 which is connected to the output of the subtraction circuit 30. The interpolator 160 is necessary to match data rates as the data rate at the second output 47 is greater than the data rate of the output of the subtraction circuit 30. $P_1$ is the interpolation factor for the interpolator 160.

The purpose of the high-pass aliasing rejection filter 135 is to replicate from the output of the fast digitizing circuit 10 the signals of those frequencies causing aliasing in the slow digitizing circuit 20 so that they may eventually be used to compensate for the aliasing in the slow digitizing circuit 20. The compressor 140 folds the frequency component at $f_1$ from the fast digitizing circuit 10 down to the aliased frequency $f_A$ in the slow digitizing circuit 20 so that it can be subtracted from the aliased signal at the output of the slow digitizing circuit 20. $D_S$ is the decimation factor for the compressor 140. Since the high-pass aliasing rejection filter 135 cannot completely reject all low-frequency content, the amplitudes of the non-aliased signals in the output from subtracter 30 are perturbed. The purpose of the matched aliasing rejection filter 170 is to match the low-frequency amplitude changes present in the output of subtracter 30 due to the high-pass aliasing rejection filter 135. If the matched aliasing rejection filter 170 and the high-pass aliasing rejection filter 135 are identical, the summation in the merge circuit 50 corrects the low-frequency amplitude changes due to the alias replication and subtraction.

Figure 4:
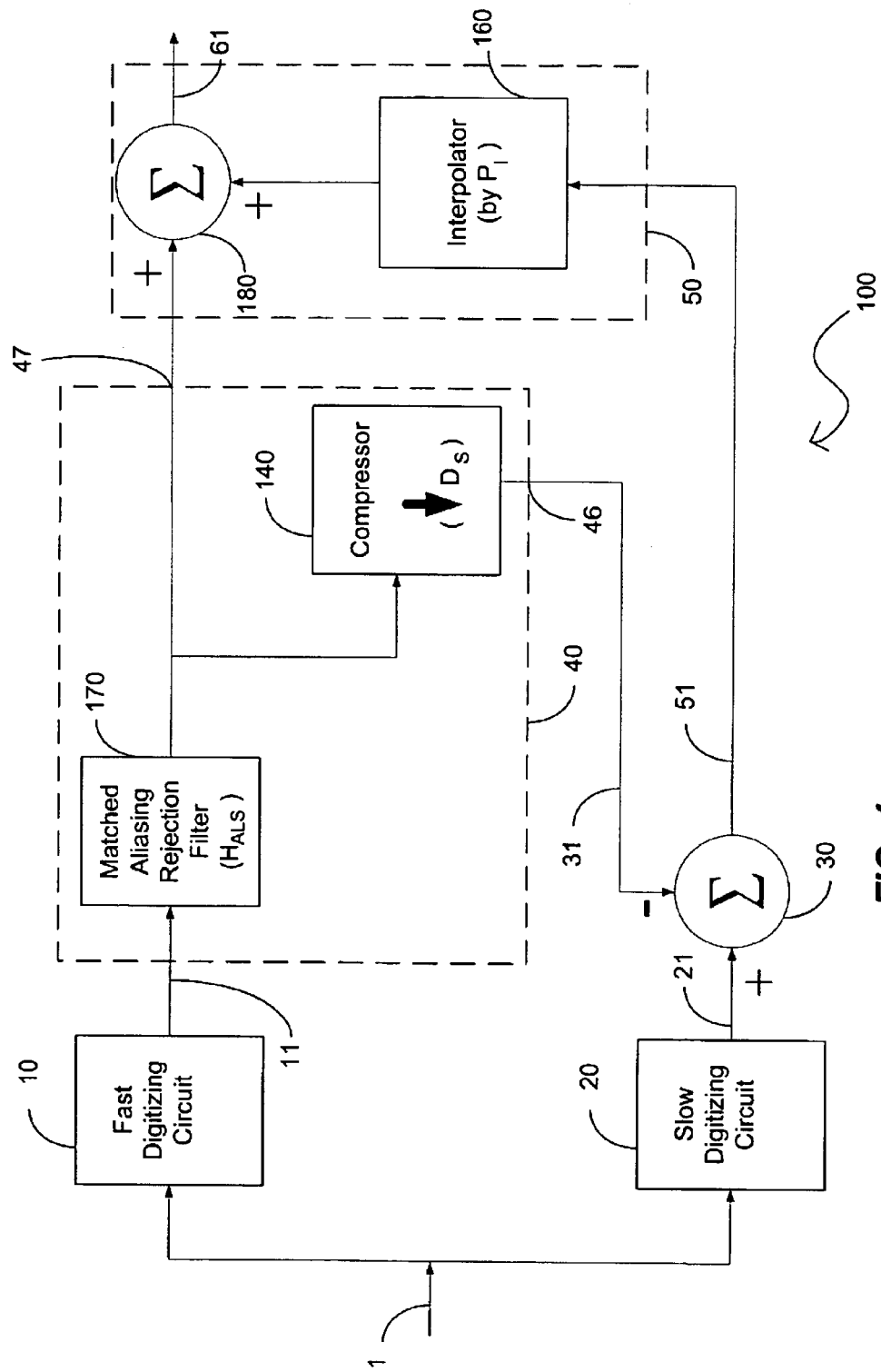
FIG. 4 is a drawing of yet another signal processing system as described in various representative embodiments consistent with the teachings of the invention.

FIG. 4 is a drawing of yet another signal processing system 100 as described in various representative embodiments consistent with the teachings of the invention. In FIG. 4, the high-pass filter and alias signal replication circuit 40 of FIG. 3 has been modified by removing the high-pass aliasing rejection filter 135. The function of this filter is performed in FIG. 4 by the matched aliasing rejection filter 170. As such in FIG. 4, the high-pass filter and alias signal replication circuit 40 comprises the matched aliasing rejection filter 170 and the compressor 140. The input of the matched aliasing rejection filter 170 is connected to the input of the high-pass filter and alias signal replication circuit 40. The output of the matched aliasing rejection filter 170 is connected to the second output 47 of the high-pass filter and alias signal replication circuit 40 and to the input of the compressor 140. The output of the compressor 140 is connected to the first output 46 of the high-pass filter and alias signal replication circuit 40.

Also in FIG. 4, the merge circuit 50 comprises an interpolator 160 and a summation circuit 180. One of the inputs to the summation circuit 180 is connected to the input of the merge circuit 50 which is connected to the second output 47, and the other input to the summation circuit 180 is connected to the output of the interpolator 160. The input of the interpolator 160 is connected to the input of the merge circuit 50 which is connected to the output of the subtraction circuit 30. Again the interpolator 160 is used to match data rates as the data rate at the second output 47 is greater than the data rate of the output of the subtraction circuit 30. If the matched aliasing rejection filter 170 and the high-pass aliasing rejection filter 135 in FIG. 3 are identical, FIG. 3 and FIG. 4 are functionally equivalent, but FIG. 4 is a more efficient implementation.

Figure 5:
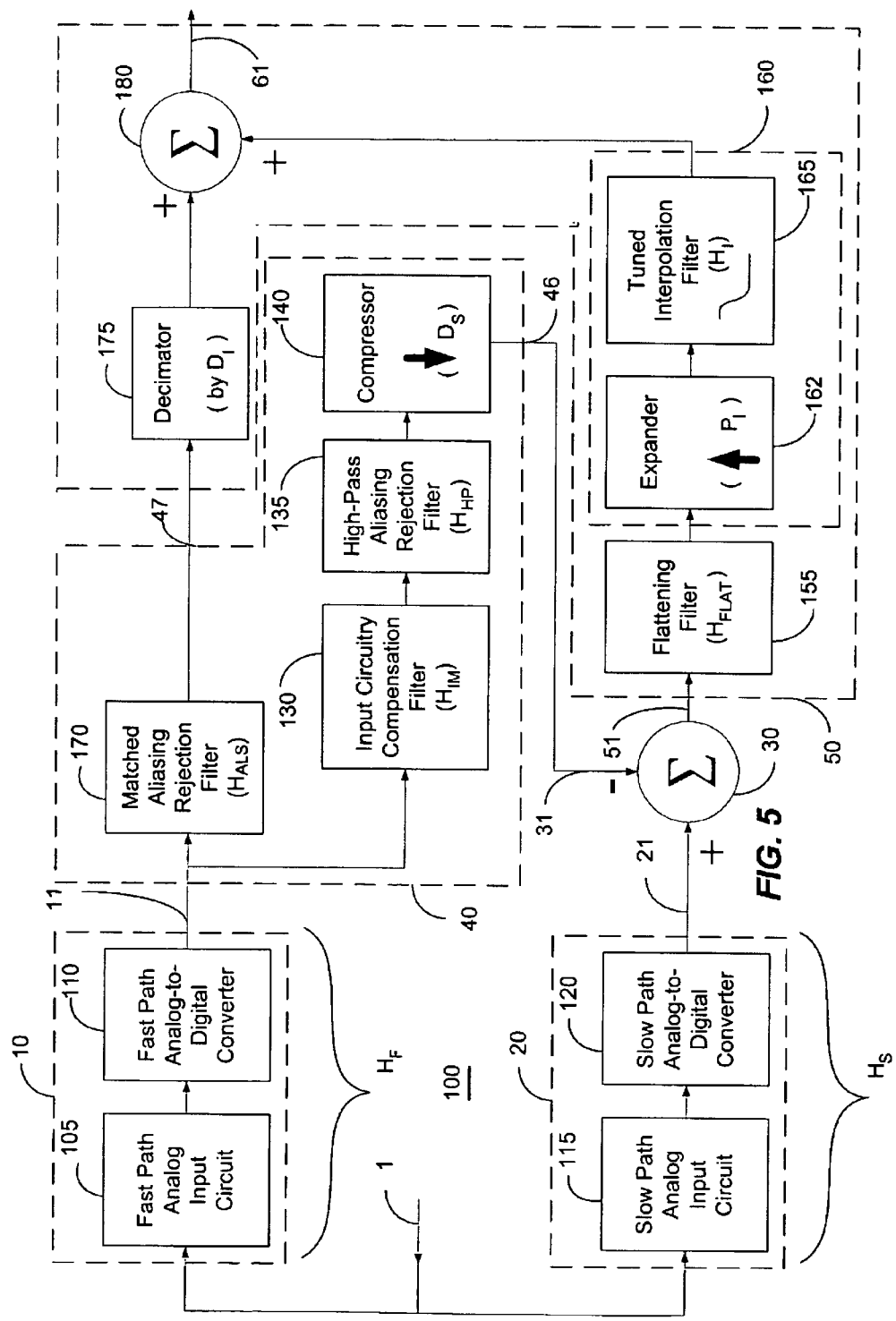
FIG. 5 is a drawing of still another signal processing system as described in various representative embodiments consistent with the teachings of the invention.

FIG. 5 is a drawing of still another signal processing system 100 as described in various representative embodiments consistent with the teachings of the invention. In FIG. 5, the fast digitizing circuit 10 comprises a fast path analog input circuit 105, also referred to herein as a first analog circuit 105, and a fast path analog-to-digital converter 110, also referred to herein as a first analog-to-digital converter 110; the slow digitizing circuit 20 comprises a slow path analog input circuit 115, also referred to herein as a second analog circuit 115, and a slow path analog-to-digital converter 120, also referred to herein as a second analog-to-digital converter 120; the high-pass filter and alias signal replication circuit 40 comprises the matched aliasing rejection filter 170, an input circuitry compensation filter 130, also referred to herein as a compensation filter 130, the high-pass aliasing rejection filter 135, and a compressor 140; and the merge circuit 50 comprises a decimator 175, a summation circuit 180, a flattening filter 155, and the interpolator 160 wherein the interpolator comprises an expander 162 and an interpolation filter 165.

The input of the fast path analog input circuit 105 is connected to the input of the fast digitizing circuit 10; the output of the fast path analog input circuit 105 is connected to the input of the fast path analog-to-digital converter 110; and the output of the fast path analog-to-digital converter 110 is connected to the output of the fast digitizing circuit 10.

The input of the slow path analog input circuit 115 is connected to the input of the slow digitizing circuit 20; the output of the slow path analog input circuit 115 is connected to the input of the slow path analog-to-digital converter 120; and the output of the slow path analog-to-digital converter 120 is connected to the output of the slow digitizing circuit 20.

The inputs of the matched aliasing rejection filter 170 and the input of the input circuitry compensation filter 130 are connected to the input of the high-pass filter and alias signal replication circuit 40. The output of the matched aliasing rejection filter 170 is connected to the second output 47 of the high-pass filter and alias signal replication circuit 40. The output of the input circuitry compensation filter 130 is connected to the input of the high-pass aliasing rejection filter 135. The output of the high-pass aliasing rejection filter 135 is connected to the input of the compressor 140. The output of the compressor 140 is connected to the first output 46 of the high-pass filter and alias signal replication circuit 40.

One of the inputs to the summation circuit 180 is connected to the output of the decimator 175, wherein the input to the decimator 175 is connected to one of the inputs to the merge circuit 50, wherein that input to the merge circuit 50 is connected to the second output 47 of the high-pass filter and alias signal replication circuit 40. The other input to the summation circuit 180 is connected to the output of the interpolation filter 165. The input of the interpolation filter 165 is connected to the output of the expander 162. The input of the expander 162 is connected to the output of the flattening filter 155, and the input of the flattening filter 155 is connected to that input of the merge circuit 50 that is connected to the output of the subtraction circuit 30.

In FIG. 5, the combination of the decimator 175, the expander 162, and the interpolation filter 165 is used to match data rates as the data rate at the second output 47 is greater than the data rate of the output of the subtraction circuit 30. The matched data rate is referred to herein as the match data rate. The decision to include both the decimator 175 and the interpolator 160 is essentially a design decision.

Fast and slow path analog input circuits 105,115 can provide load buffering for the signal circuitry so that the system input 1 does not load down the circuitry from which the input analog signal is obtained. It can also reduce the detected signal level to an appropriate level for the fast and slow path analog-to-digital converters 110,120, and it can provide any other signal conditioning that might be needed by the fast and slow path analog-to-digital converters 110, 120.

As indicated in FIG. 5, (1) the transfer function of the fast digitizing circuit 10 at frequency f is $H_F(f)$; (2) the transfer function of the slow digitizing circuit 20 at frequency f is $H_S(f)$; (3) the transfer function of the matched aliasing rejection filter 170 at frequency f is $H_{ALS}(f)$; (4) the transfer function of the high-pass aliasing rejection filter 135 at frequency f is $H_{HP}(f)$; (5) the transfer function of the input circuitry compensation filter 130 is $H_{IM}(f)$; (6) the transfer function of the flattening filter 155 is $H_{FLAT}(f)$; and (7) the transfer function of the interpolation filter 165 is $H_1(f)$. Ds is the decimation factor for the compressor 140; $D_S$ is the decimation factor for the decimator 175; and $P_1$ is the interpolation factor for the interpolator 160.

In general in a representative example, the fast digitizing circuit 10 does not significantly filter or distort data at the frequencies of interest. However, the slow digitizing circuit 20 path does distort the data due primarily to its lower bandwidth. Depending upon the particular design, the slow digitizing circuit 20 can have significant roll-off at higher frequencies. In the input circuitry compensation filter 130 and the flattening filter 155, the respective transfer functions $H_{IM}(f)$ and $H_{FLAT}(f)$ compensate for frequency dependency in $H_S(f)$. The transfer function $H_{IM}(f)$ is an approximation to $H_S(f)/H_F(f)$ over all frequencies of interest. The effect of $H_{IM}(f)$ is to filter the data from the fast digitizing circuit 10 to match the transfer function of the slow digitizing circuit 20 in both amplitude and phase. The input circuitry compensation filter 130 hinders those frequencies hindered by $H_S(f)$ and enhances those frequencies enhanced by $H_S(f)$. The transfer function $H_{FLAT}(f)$ is an approximation to $1/H_S(f)$. The effect of $H_{FLAT}(f)$ is to create a flat transfer function for the non-aliased frequencies captured by the slow digitizing circuit 20. The flattening filter 155 hinders those frequencies enhanced by $H_S(f)$ and enhances those frequencies hindered by $H_S(f)$. The shape of the transfer functions $H_{IM}(f)$ and $H_{FLAT}(f)$ are effected digitally, whereas much of the shape of the transfer function $H_S(f)$ is caused by analog circuitry.

The inputs to the summation circuit 180 should be significantly phase aligned as well as amplitude matched for correct merge. Maintaining phase alignment typically requires specific filter design techniques for the digital filters and insertion of delay blocks on some branches in FIG. 5. The required delays may be integer or fractional. Connection paths that may require a delay block include the second connection path 21, the connection path between the high-pass aliasing rejection filter 135 and the compressor 140, the connection path before the decimator 175, and the connection path after the interpolation filter 165.

The selection of the match data rate and the interpolation filter 165 significantly determine the amount of computation necessary to obtain the desired output. The match data rate is selected based on the target system output rate that is generally determined by the target bandwidth of the application. The match data rate combined with the slow and fast digitizing rates dictate the decimation factor $D_S$, the decimation factor $D_1$, and the interpolation factor $P_1$. Unless a polyphase implementation is used, the computation required for the combination of the input circuitry compensation filter 130 and the high-pass aliasing rejection filter 135 is inversely proportional to the decimation factor $D_S$. Unless a polyphase implementation is used, the computation required for the combination of the matched aliasing rejection filter 170 and the low-pass filter implicit in the decimator 175 is inversely proportional to the decimation factor $D_1$. Unless a polyphase implementation is used, the computation required for the interpolation filter 165 is proportional to the square of the interpolation factor $P_1$. With a polyphase implementation, the computation required for the interpolation filter 165 is proportional to the interpolation factor $P_1$. For a given $P_1$, the order of, and thus the computation required for, the interpolation filter 165 can be reduced by widening the transition band of $H_1(f)$. This can be accomplished by lowering the start of the pass-band of $H_{HP}(f)$, subject to other design constraints. Application specific requirements, particularly pass-band ripple and stop-band rejection, may also affect the order of the interpolation filter 165. With adjustments for $H_{HP}(f)$ and application specific requirements, the interpolation filter 165 is referred to as a tuned interpolation filter 165.

Figure 6:
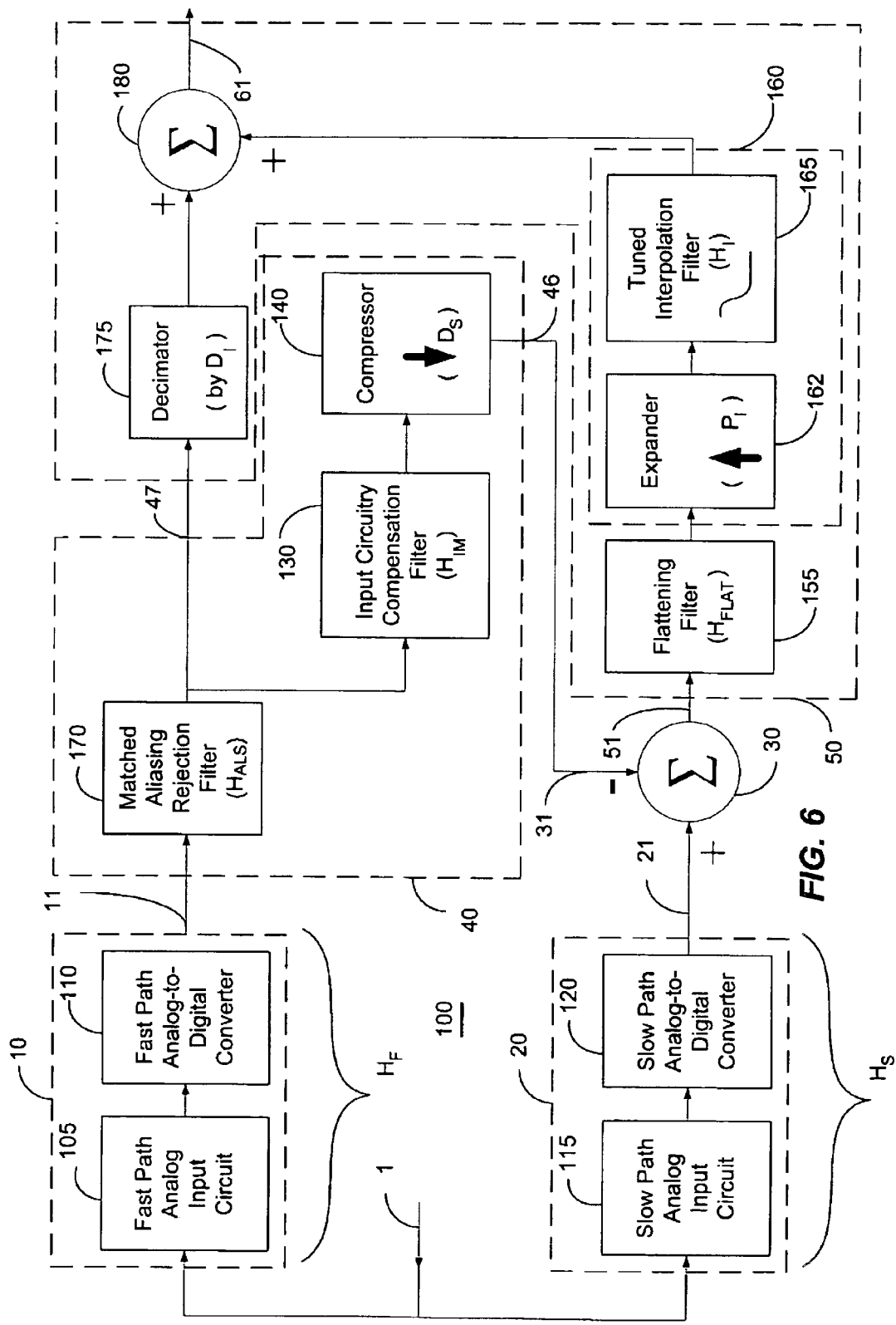
FIG. 6 is a drawing of even another signal processing system as described in various representative embodiments consistent with the teachings of the invention.

FIG. 6 is a drawing of even another signal processing system 100 as described in various representative embodiments consistent with the teachings of the invention. The high-pass filter and alias signal replication circuit 40 of FIG. 6 differs from that of FIG. 5. In FIG. 6, the high-pass filter and alias signal replication circuit 40 comprises the matched aliasing rejection filter 170, an input circuitry compensation filter 130, and the compressor 140.

The input of the matched aliasing rejection filter 170 is connected to the input of the high-pass filter and alias signal replication circuit 40. The output of the matched aliasing rejection filter 170 is connected to the second output 47 of the high-pass filter and alias signal replication circuit 40 and to the input to the input circuitry compensation filter 130. The output of the input circuitry compensation filter 130 is connected to the input of the compressor 140. The output of the compressor 140 is connected to the first output 46 of the high-pass filter and alias signal replication circuit 40. Note that one fewer filter, the high-pass aliasing rejection filter 135, is used in this representative embodiment. This savings in components is possible when the transfer function of the high-pass aliasing rejection filter 135 is the same as the transfer function for the matched aliasing rejection filter 170.

In FIG. 6, as in FIG. 5, one of the inputs to the summation circuit 180 is connected to the output of the decimator 175, wherein the input to the decimator 175 is connected to one of the inputs to the merge circuit 50, wherein that input to the merge circuit 50 is connected to the second output 47 of the high-pass filter and alias signal replication circuit 40. The other input to the summation circuit 180 is connected to the output of the interpolation filter 165. The input of the interpolation filter 165 is connected to the output of the expander 162. The input of the expander 162 is connected to the output of the flattening filter 155, and the input of the flattening filter 155 is connected to that input of the merge circuit 50 that is connected to the output of the subtraction circuit 30.

Figure 7A:
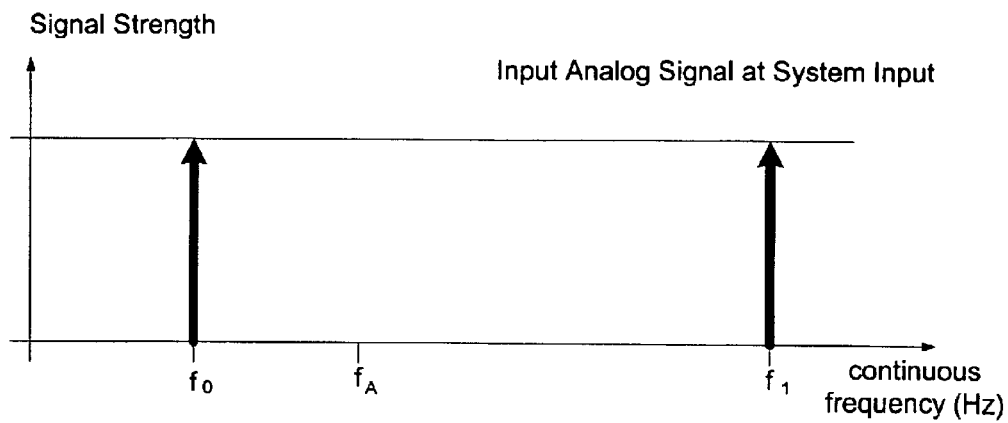
FIG. 7A is a plot of signal amplitude vs frequency at a point in FIG. 5.
Figure 7B:
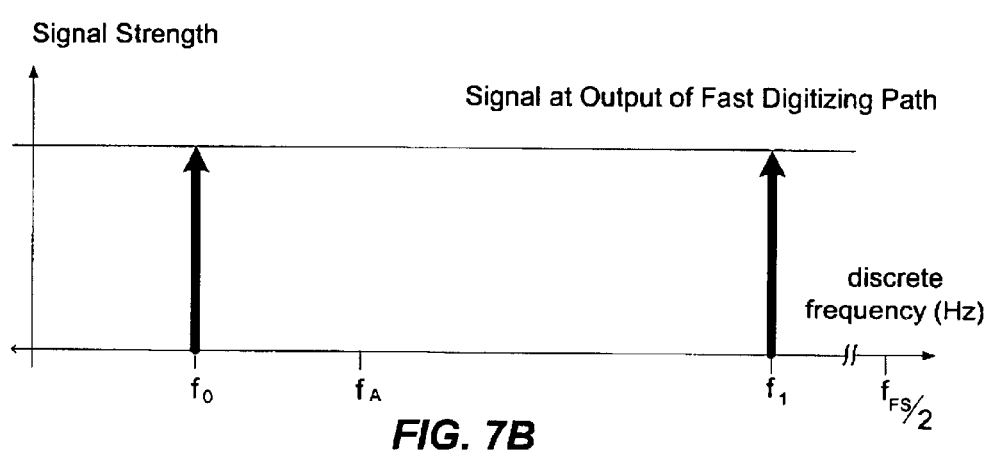
FIG. 7B is a plot of signal amplitude vs. frequency at another point in FIG. 5.
Figure 7C:
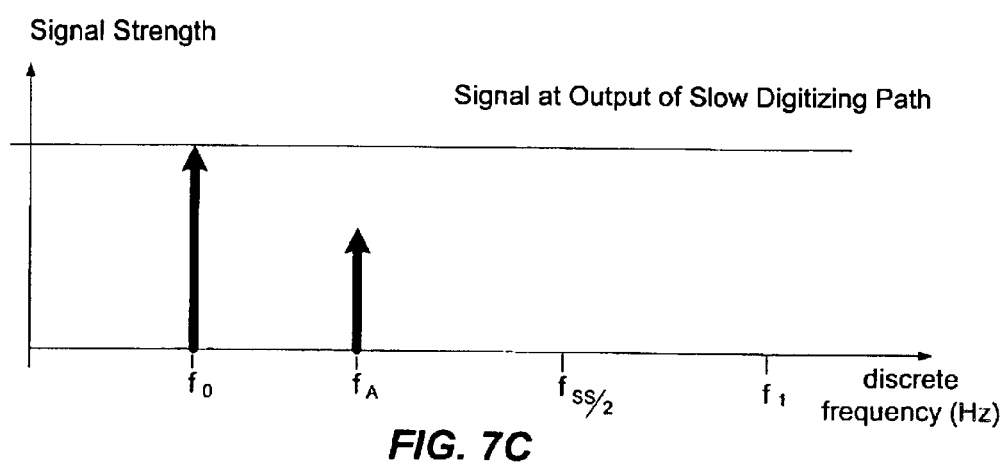
FIG. 7C is a plot of signal amplitude vs. frequency at yet another point in FIG. 5.
Figure 7D:
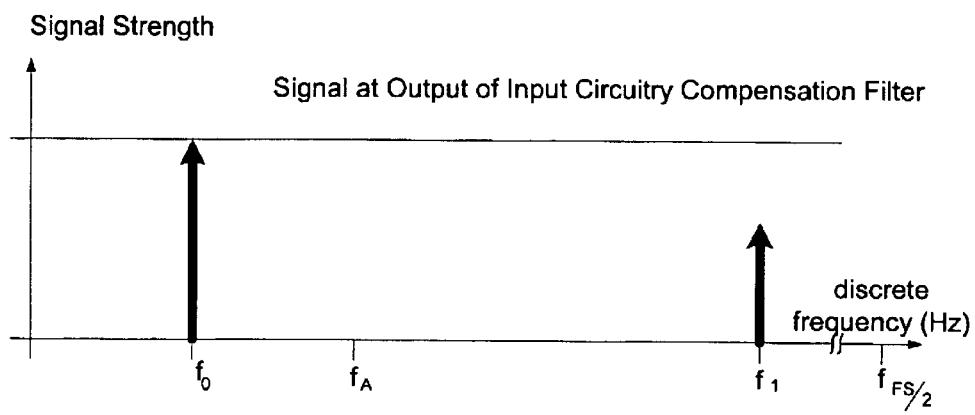
FIG. 7D is a plot of signal amplitude vs. frequency at still another point in FIG. 5.
Figure 7E:
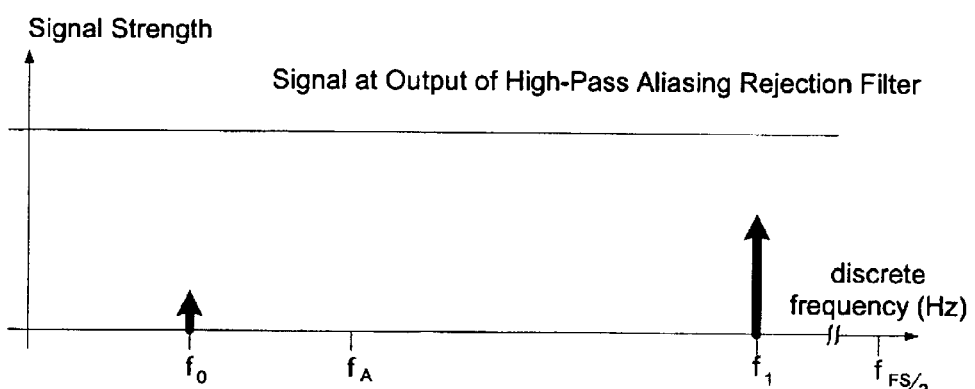
FIG. 7E is a plot of signal amplitude vs. frequency at even another point in FIG. 5.
Figure 7F:
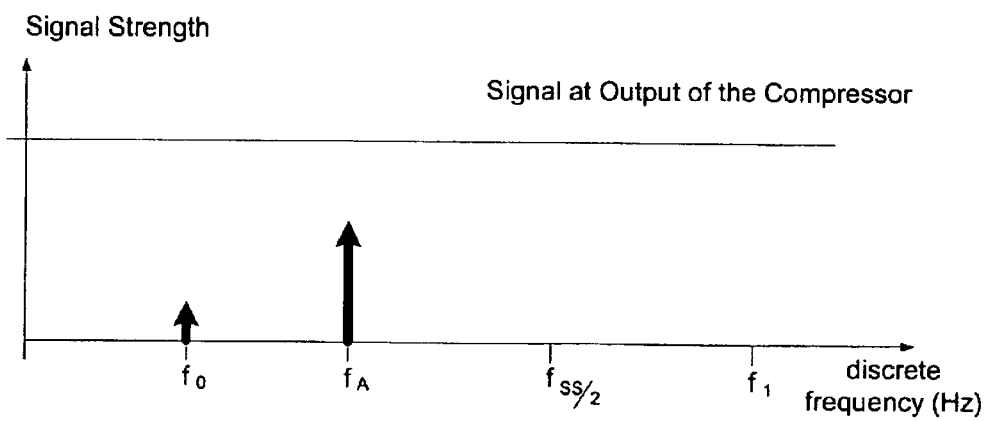
FIG. 7F is a plot of signal amplitude vs. frequency at even yet another point in FIG. 5.
Figure 7G:
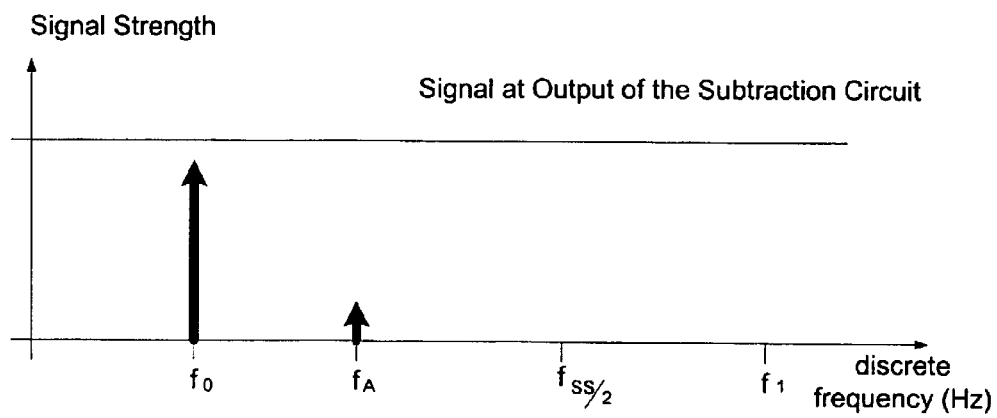
FIG. 7G is a plot of signal amplitude vs. frequency at even still another point in FIG. 5.
Figure 7H:
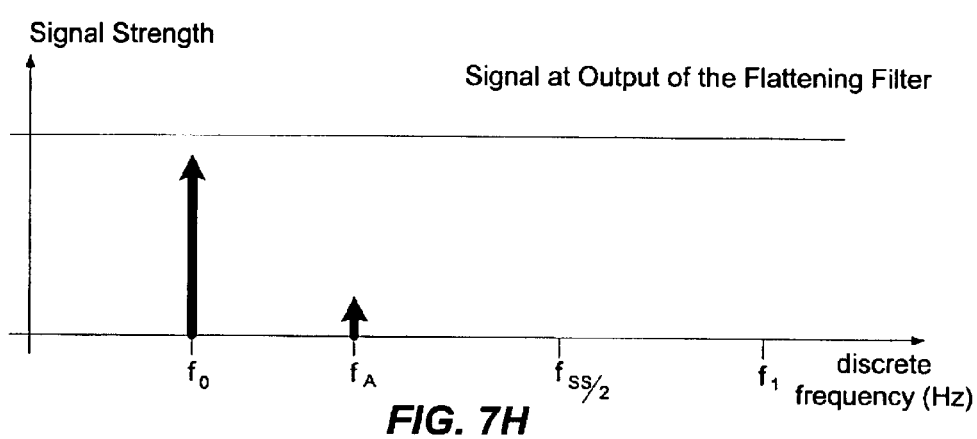
FIG. 7H is a plot of signal amplitude vs. frequency at but even another point in FIG. 5.
Figure 7I:
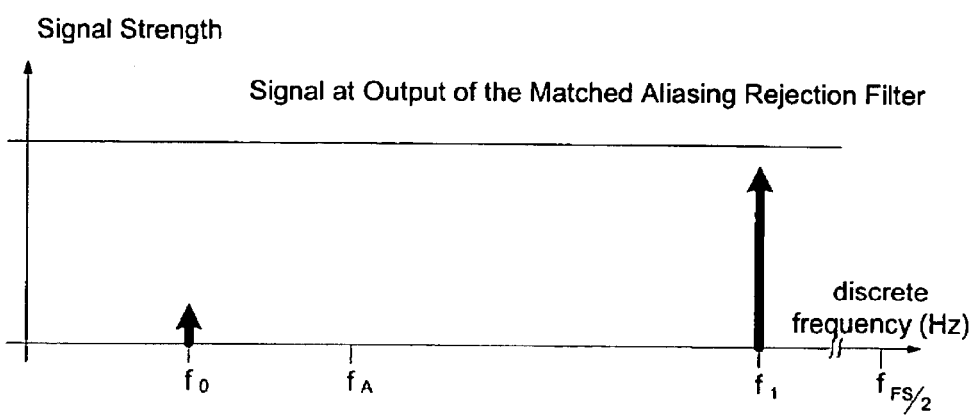
FIG. 7I is a plot of signal amplitude vs. frequency at but even yet another point in FIG. 5.
Figure 7J:
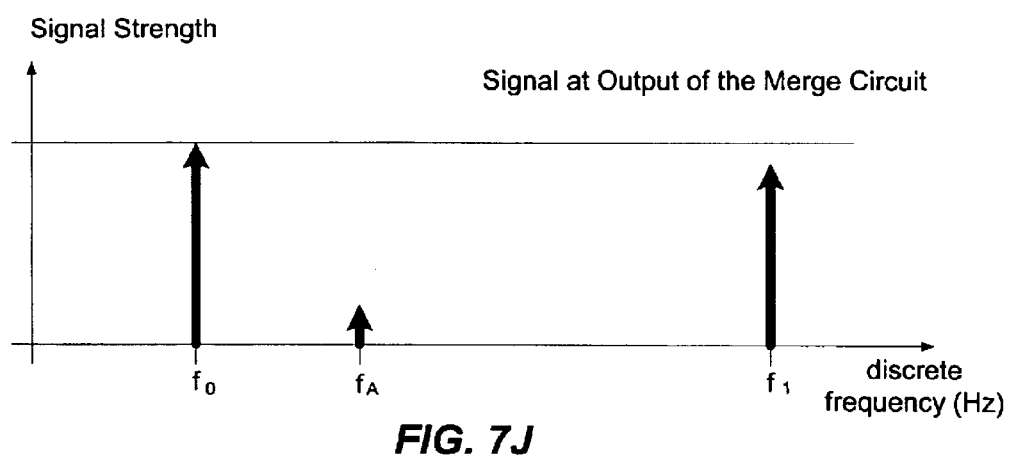
FIG. 7J is a plot of signal amplitude vs. frequency at but even still another point in FIG. 5.

FIGS. 7A–7J show plots of signal amplitudes resulting from an input analog signal at various points in FIG. 5. In particular, FIG. 7A is a plot of signal amplitude vs. frequency at a point in FIG. 5; FIG. 7B is a plot of signal amplitude vs. frequency at another point in FIG. 5; FIG. 7C is a plot of signal amplitude vs. frequency at yet another point in FIG. 5; FIG. 7D is a plot of signal amplitude vs. frequency at still another point in FIG. 5; FIG. 7E is a plot of signal amplitude vs. frequency at even another point in FIG. 5; FIG. 7F is a plot of signal amplitude vs. frequency at even yet another point in FIG. 5; FIG. 7G is a plot of signal amplitude vs. frequency at even still another point in FIG. 5; FIG. 7H is a plot of signal amplitude vs. frequency at but even another point in FIG. 5; FIG. 7I is a plot of signal amplitude vs. frequency at but even yet another point in FIG. 5; and FIG. 7J is a plot of signal amplitude vs. frequency at but even still another point in FIG. 5.

In the following, equations for the transfer functions of the various components of FIG. 5 will be used to obtain equations describing the signals resultant from the detection of the input analog signal 4 at the system input 1. The resultant equation for the signal at the system output 61 will be simplified by placing certain constraints on the transfer functions of the components of the system 100. The absolute and relative amplitudes of the signals in FIGS. 7A–7J are not intended to be precise. They are for illustrative purposes only. As appropriate, each of the FIGS. 7A–7J will be identified with the particular equation set which can be used to describe it.

Equations describing signal amplitudes at various points within the system 100 are as follows:

(A) The analog signal at the system input 1 is assumed to comprise two components $I_0$ and $I_1$ as previously defined. Thus, signal amplitudes at the three frequencies of interest $f_0$, $f_A$, and $f_1$ at this point (system input 1; see FIGS. 5 and 6) are as follows:

$f_0$: $I_0$ (Equation Set A)

$f_A$: (none)

$f_1$: $I_1$

The above equations describe the signals shown in FIG. 7A.

(B) The transfer function $H_F(f)$ of the fast digitizing circuit 10 slightly modifies the output of the fast digitizing circuit 10 for both the lower and higher frequencies. Thus, signal amplitudes at the three frequencies of interest $f_0$, $f_A$, and $f_1$ at this point (first connection path 11; see FIGS. 5 and 6) are as follows:

$f_0$: $H_F(f_0)*I_0$ (Equation Set B)

$f_A$: (none)

$f_1$: $H_F(f_1)*I_1$

The above equations describe the signals shown in FIG. 7B.

(C) The transfer function $H_S(f)$ of the slow digitizing circuit 20 progressively attenuates the output of the slow digitizing circuit 20 at higher frequencies. The sampling operation aliases all frequencies above half the sampling rate to a rate below half the sampling frequency. Thus, signal amplitudes at the three frequencies of interest $f_0$, $f_A$, and $f_1$ at this point (second connection path 21; see FIGS. 5 and 6) are as follows:

$f_0$: $H_S(f_0)*I_0$ (Equation Set C)

$f_A$: $H_S(f_1)*I_1$ $f_1$: (none)

The above equations describe the signals shown in FIG. 7C.

(D) The signal amplitudes at the output of input circuitry compensation filter 130 as shown in FIG. 5 are as follows:

$f_0$: $H_{IM}(f_0)*H_F(f_0)*I_0$ (Equation Set D)

$f_A$: (none)

$f_1$: $H_{IM}(f_1)*H_F(f_1)*I_1$

The above equations describe the signals shown in FIG. 7D.

(E) The signal amplitudes at the output of the high-pass aliasing rejection filter 135 as shown in FIG. 5 are as follows:

$f_0$: $H_{HP}(f_0)*H_{IM}(f_0)*H_F(f_0)*I_0$ (Equation Set E)

$f_A$: (none)

$f_1$: $H_{HP}(f_1)*H_{IM}(f_1)*H_F(f_1)*I_1$

The above equations describe the signals shown in FIG. 7E.

(F) The signal amplitudes at the output of the compressor 140 (third connection path 31; see FIGS. 5 and 6) are as follows:

$f_0$: $H_{HP}(f_0)*H_{IM}(f_0)*H_F(f_0)*I_0$ (Equation Set F)

$f_A$: $H_{HP}(f_1)*H_{IM}(f_1)*H_F(f_1)*I_1$ $f_1$: (none)

The above equations describe the signals shown in FIG. 7F.

(G) The signal amplitudes at the output of the subtraction circuit 30 (fifth connection path 51; see FIGS. 5 and 6) are as follows:

$f_0$: $[H_S(f_0)-H_{HP}(f_0)*H_{IM}(f_0)*H_F(f_0)]*I_0$ (Equation Set G)

$f_A$: $[H_S(f_1)-H_{HP}(f_1)*H_{IM}(f_1)*H_F(f_1)]*I_1$ $f_1$: (none)

The above equations describe the signals shown in FIG. 7G.

(H) The signal amplitudes at the output of the flattening filter 155 (see FIGS. 5 and 6) are as follows:

$f_0$: $H_{FLAT}(f_0)*[H_S(f_0)-H_{HP}(f_0)*H_{IM}(f_0)*H_F(f_0)]*I_0$ (Equation Set H)

$f_A$: $H_{FLAT}(f_A)*[H_S(f_1)-H_{HP}(f_1)*H_{IM}(f_1)*H_F(f_1)]*I_1$ $f_1$: (none)

The above equations describe the signals shown in FIG. 7H.

(I) The signal amplitudes at the output of the matched aliasing rejection filter 170 (see FIGS. 5 and 6) are as follows:

$f_0$: $H_{ALS}(f_0)*H_F(f_0)*I_0$ (Equation Set I)

$f_A$: (none)

$f_1$: $H_{ALS}(f_1)*H_F(f_1)*I_1$

The above equations describe the signals shown in FIG. 7I.

In a representative example as described in the following paragraphs, the following equations ignore the effects of the decimator 175, as well as the combination of the expander 162 and the interpolation filter 165.

(J-1) The signal amplitudes at the output of the merge circuit 50 (the output of the summation circuit 180; sixth connection path 61; system output 61;

See FIGS. 5 and 6) are as follows:

$f_0$: $H_{FLAT}(f_0)*[H_S(f_0)-H_{HP}(f_0)*H_{IM}(f_0)*H_F(f_0)]*I_0 + H_{ALS}(f_0)*H_F(f_0)*I_0$ (Equation Set J-1)

$f_A$: $H_{FLAT}(f_A)*[H_S(f_1)-H_{HP}(f_1)*H_{IM}(f_1)*H_F(f_1)]*I_1$ $f_1$: $H_{ALS}(f_1)*H_F(f_1)*I_1$

The above equations describe the signals shown in FIG. 7J.

(J-2) The system transfer function is normalized by applying the constraint that $H_F(f)=1$ for all frequencies of interest. The signal amplitudes at the output of the merge circuit 50 (the output of the summation circuit 180; sixth connection path 61; system output 61; See FIGS. 5 and 6) are as follows:

$$f_0: H_{FLAT}(f_0)*[H_S(f_0)-H_{HP}(f_0)*H_{IM}(f_0)]*I_0 + H_{ALS}(f_0)*I_0 \quad \text{(Equation Set J-2)}$$

$$f_A: H_{FLAT}(f_A)*[H_S(f_1)-H_{HP}(f_1)*H_{IM}(f_1)]*I_1$$

$$f_1: H_{ALS}(f_1)*I_1$$

The above equations describe the signals shown in FIG. 7J with the constraint just applied.

(J-3) The constraint is now applied that the transfer functions of the high-pass aliasing rejection filter 135 and the matching aliasing rejection filter 170 at frequency $f_1$ are approximately equal to 1 (i.e., $H_{HP}(f_1) \sim 1$ and $H_{ALS}(f_1) \sim 1$). The signal amplitudes at the output of the merge circuit 50 (the output of the summation circuit 180; sixth connection path 61; system output 61; See FIGS. 5 and 6) are as follows:

$$f_0: H_{FLAT}(f_0)*[H_S(f_0)-H_{HP}(f_0)*H_{IM}(f_0)]*I_0 + H_{ALS}(f_0)*I_0 \quad \text{(Equation Set J-3)}$$

$$f_A: H_{FLAT}(f_A)*[H_S(f_1)-\sim H_{IM}(f_1)]*I_1$$

$$f_1: \sim I_1$$

The above equations describe the signals shown in FIG. 7J with the constraint just applied.

(J-4) The constraint is now applied that the transfer function of input circuitry compensation filter 130, $H_{IM}(f)$, is approximately equal to the transfer function of the slow digitizing circuit 20, $H_S(f)$, at frequency $f_1$, (i.e., $H_{IM}(f_1) \sim H_S(f_1)$). The signal amplitudes at the output of the merge circuit 50 (the output of the summation circuit 180; sixth connection path 61; system output 61; See FIGS. 5 and 6) are as follows:

$$f_0: H_{FLAT}(f_0)*[H_S(f_0)-H_{HP}(f_0)*H_{IM}(f_0)]*I_0 + H_{ALS}(f_0)*I_0 \quad \text{(Equation Set J-4)}$$

$$f_A: \sim 0$$

$$f_1: \sim I_1$$

The above equations describe the signals shown in FIG. 7J with the constraint just applied.

(J-5) The constraint is now applied that the transfer function of the high-pass aliasing rejection filter 135 and the matching aliasing rejection filter 170 at frequency $f_0$ are equal (i.e., $H_{HP}(f_0)=H_{ALS}(f_0)$). The signal amplitudes at the output of the merge circuit 50 (the output of the summation circuit 180; sixth connection path 61; system output 61; See FIGS. 5 and 6) are as follows:

$$f_0: H_{FLAT}(f_0)*[H_S(f_0)-H_{ALS}(f_0)*H_{IM}(f_0)]*I_0 + H_{ALS}(f_0)*I_0 \quad \text{(Equation Set J-5)}$$

$$f_A: \sim 0$$

The above equations describe the signals shown in FIG. 7J with the constraint just applied.

(J-6) The constraint is now applied that the transfer function of the slow digitizing circuit 20, $H_S(f)$, at frequency $f_0$ is approximately equal to that of the inverse of the transfer function of flattening filter 155 (i.e., $H_S(f_0) \sim 1/H_{FLAT}(f_0)$). The signal amplitudes at the output of the merge circuit 50 (the output of the summation circuit 180; sixth connection path 61; system output 61; See FIGS. 5 and 6) are as follows:

$$f_0: \{1+H_{ALS}(f_0)*[1-H_{FLAT}(f_0)*H_{IM}(f_0)]\}*I_0 \quad \text{(Equation Set J-6)}$$

$$f_A: \sim 0$$

$$f_1: \sim I_1$$

The above equations describe the signals shown in FIG. 7J with the constraint just applied.

(J-7) The constraint is now applied that the transfer function of input circuitry compensation filter 130, $H_{IM}(f)$, is approximately equal to the transfer function of the slow digitizing circuit 20, $H_S(f)$, at frequency $f_0$ (i.e., $H_{IM}(f_0) \sim H_S(f_0)$). The signal amplitudes at the output of the merge circuit 50 (the output of the summation circuit 180; sixth connection path 61; system output 61; See FIGS. 5 and 6) are as follows:

$$f_0: \sim \{1+H_{ALS}(f_0)*[1-\sim H_{FLAT}(f_0)*H_S(f_0)]\}*I_0 \sim \{1+H_{ALS}(f_0)*[1-\sim 1]\}*I_0 \quad \text{(Equation Set J-7)}$$

$$f_A: \sim 0$$

$$f_1: \sim I_1$$

The above equations describe the signals shown in FIG. 7J with the constraint just applied.

(J-8) Simplification of the above equations produces the results as follows.

$$f_0: \sim I_0 \quad \text{(Equation Set J-8)}$$

$$f_A: \sim 0$$

$$f_1: \sim I_1$$

The above equations describe the signals shown in FIG. 7J and are the signal amplitudes at the output of the merge circuit 50 (the output of the summation circuit 180; sixth connection path 61; system output 61; See FIGS. 5 and 6).

Note that Equation set J-8 recovers a digitized form of the input analog signal with a precision dependent on the accuracy of the constraints specified above.

Figure 8:
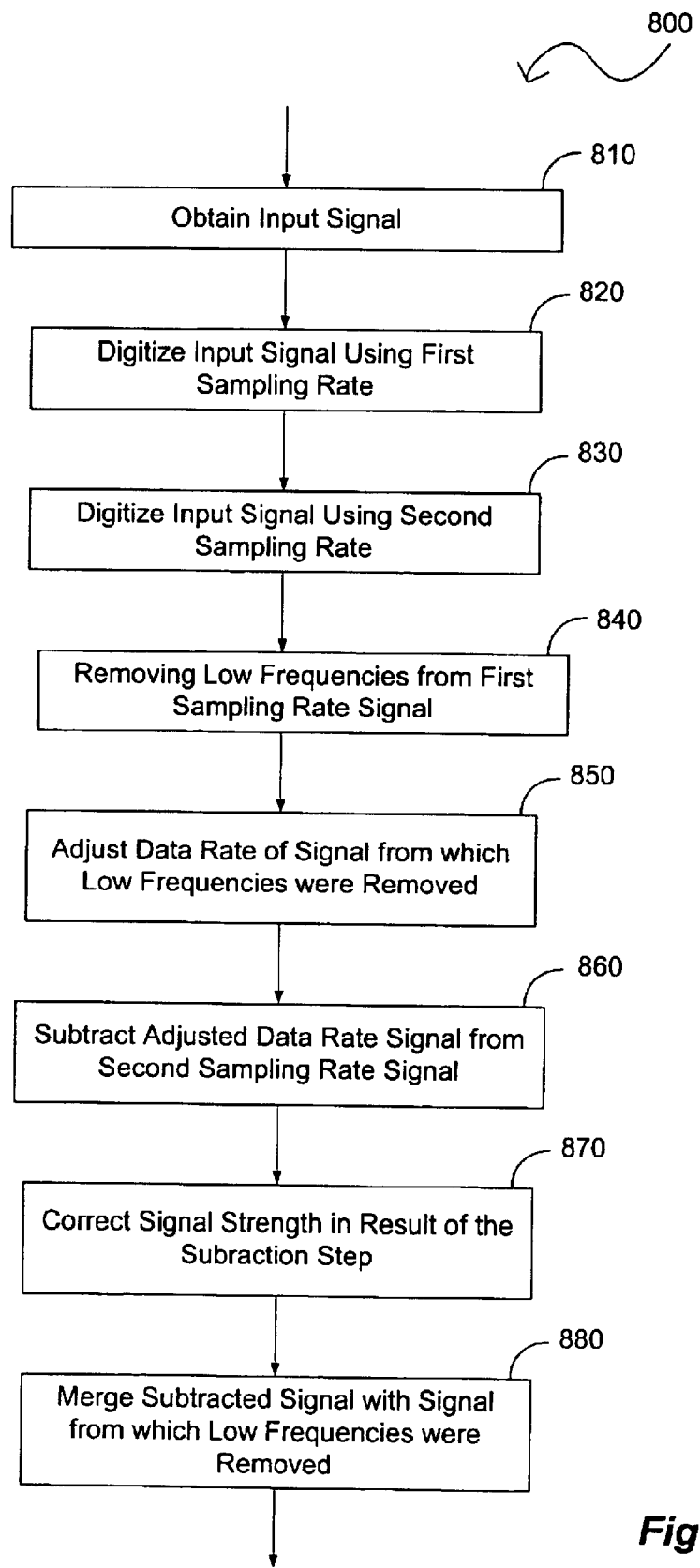
FIG. 8 is a flow chart of a signal processing method as described in various representative embodiments consistent with the teachings of the invention.

FIG. 8 is a flow chart of a signal processing method 800 as described in various representative embodiments consistent with the teachings of the invention. In block 810, the input analog signal is obtained. Block 810 then transfers control to block 820.

In block 820, the input analog signal is digitized using a first sampling rate.

Block 820 then transfers control to block 830.

In block 830, the input analog signal is digitized using a second sampling rate, wherein the first sampling rate is faster than the second sampling rate. Block 830 then transfers control to block 840.

In block 840, the low frequency components of the first sampling rate digitized signal are removed. Block 840 then transfers control to block 850.

In block 850, the data rate of the low frequency removed components signal is adjusted to that of the digitized second sampling rate signal. Block 850 then transfers control to block 860.

In block 860, the data rate adjusted signal is subtracted from the digitized second sampling rate signal. Block 860 then transfers control to block 870.

In block 870, the signal strength from the result of the subtraction of block 860 is corrected via various combinations of the flattening filter 155 and the interpolator 160. Block 870 then transfers control to block 880.

In block 880, the signal resulting from the subtraction step and the low frequency removed components signal are merged. Block 880 then terminates the process.

As is the case in many data-processing products, the system 100 may be implemented as a combination of hardware and software components. Moreover, the functionality require for using the invention may be embodied in a program storage medium to be used in programming an information-processing apparatus (e.g., an electronic instrument or a personal computer) to perform in accordance with the invention. The term "program storage medium" is broadly defined herein to include any kind of computer memory such as, but not limited to, floppy disks, conventional hard disks, DVD's, CD-ROM's, Flash ROM's, non-volatile ROM, and RAM.

As previously stated, representative embodiments described herein provide techniques for increasing the bandwidth of digital processing systems which convert an analog signal into digital form without reducing the low frequency accuracy of the system. Applications requiring higher accuracy at lower frequencies can be more effectively addressed with present embodiments than with previous techniques. For some power measurement and digitizing problems, a dual path analog-to-digital conversion implementation as described herein can directly and continuously measure the input signal and thus completely replace other solutions. In such cases, the dual path system is less expensive, less complex, and contains fewer inherent limitations.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A system, comprising:
   a first circuit having first sampling rate, wherein first circuit digitizes an inputted analog signal into an outputted first digital signal;
   a second circuit having second sampling rate less than first sampling rate and having input connected to first circuit input, wherein second circuit digitizes the inputted analog signal into an outputted second digital signal and wherein when frequency of a first component of the inputted analog signal is less than half of first sampling rate and greater than half of second sampling rate, second circuit outputs an aliased component folded into an aliased frequency less than half of the second sampling rate and first circuit outputs a non-aliased component;
   an anti-aliasing circuit comprising a first high-pass filter and a compressor, wherein the anti-aliasing circuit has a first output, wherein the anti-aliasing circuit has an input connected to first circuit output, wherein anti-aliasing circuit converts the non-aliased component to approximate amplitude of aliased component and folds into the aliased frequency at first output, wherein the first high-pass filter has input connected to the input of the anti-aliasing circuit, wherein pass-band of the first high-pass filter passes frequencies greater than a pre-selected frequency less than half the second sampling rate, the compressor has input connected to output of the first high-pass filter and output connected to the first output, and wherein the compressor folds the filtered non-aliased component from the first high-pass filter having frequency less than half the second sampling rate into the aliased frequency; and
   a subtracter having inputs separately connected to second circuit output and to first output, wherein subtracter outputs first output subtracted from second circuit output.

2. The system as recited in claim 1, wherein the first circuit comprises a first analog circuit and a first analog-to-digital converter, wherein the input of the first analog circuit is connected to the input of the first circuit, wherein the output of the first analog circuit is connected to the input of the first analog-to-digital converter, wherein the output of the first analog-to-digital converter is connected to the output of the first circuit, wherein the first analog circuit transforms the analog signal via an analog operation on the analog signal and outputs that transformed analog signal at the output of the first analog circuit, and wherein the first analog-to-digital converter digitizes the transformed analog signal input into the first digital signal and outputs the first digital signal at the output of the first analog-to-digital converter.

3. The system as recited in claim 1, wherein the first circuit comprises a first analog-to-digital converter and wherein the first analog-to-digital converter digitizes the inputted analog signal into the first digital signal.

4. The system as recited in claim 1, wherein the second circuit comprises a second analog circuit and a second analog-to-digital converter, wherein the input of the second analog circuit is connected to the input of the second circuit, wherein the output of the second analog circuit is connected to the input of the second analog-to-digital converter, wherein the output of the second analog-to-digital converter is connected to the output of the second circuit, wherein the second analog circuit transforms the analog signal via an analog operation on the analog signal and outputs that transformed analog signal at the output of the second analog circuit, and wherein the second analog-to-digital converter digitizes the transformed analog signal input into the second digital signal and outputs the second digital signal at the output of the second analog-to-digital converter.

5. The system as recited in claim 1, wherein the second circuit comprises a second analog-to-digital converter and wherein the second analog-to-digital converter digitizes the inputted analog signal into the second digital signal.

6. A system, comprising:
   a first circuit having first sampling rate, wherein first circuit digitizes an inputted analog signal into an outputted first digital signal;
   a second circuit having second sampling rate less than first sampling rate and having input connected to first circuit input, wherein second circuit digitizes the inputted analog signal into an outputted second digital signal and wherein when frequency of a first component of the inputted analog signal is less than half of first sampling rate and greater than half of second sampling rate, second circuit outputs an aliased component folded into an aliased frequency less than half of the second sampling rate and first circuit outputs a non-aliased component;
   an anti-aliasing circuit comprising a first high-pass filter, a compensation filter, and a compressor, wherein the anti-aliasing circuit has a first output, wherein the anti-aliasing circuit has an input connected to first circuit output, wherein the anti-aliasing circuit converts the non-aliased component to approximate amplitude of aliased component and folds into the aliased frequency at first output, wherein the first high-pass filter has input connected to the input of the anti-aliasing circuit, wherein pass-band of the first high-pass filter passes frequencies greater than a preselected frequency less than half the second sampling rate, wherein the compensation filter has input connected to output of the first high-pass filter, wherein the compensation filter has a transfer function approximating the ratio of the transfer function of the second circuit to the transfer function of the first circuit, wherein the compressor has input connected to output of the compensation filter and output connected to the first output, and wherein the compressor folds the filtered non-aliased component from the first high-pass filter having frequency less than half the second sampling rate into the aliased frequency, and a subtracter having inputs separately connected to second circuit output and to first output, wherein subtracter outputs first output subtracted from second circuit output.

7. The system as recited in claim 6, wherein the first circuit comprises a first analog circuit and a first analog-to-digital converter, wherein the input of the first analog circuit is connected to the input of the first circuit, wherein the output of the first analog circuit is connected to the input of the first analog-to-digital converter, wherein the output of the first analog-to-digital converter is connected to the output of the first circuit, wherein the first analog circuit transforms the analog signal via an analog operation on the analog signal and outputs that transformed analog signal at the output of the first analog circuit, and wherein the first analog-to-digital converter digitizes the transformed analog signal input into the first digital signal and outputs the first digital signal at the output of the first analog-to-digital converter.

8. The system as recited in claim 6, wherein the first circuit comprises a first analog-to-digital converter and wherein the first analog-to-digital converter digitizes the inputted analog signal into the first digital signal.

9. The system as recited in claim 6, wherein the second circuit comprises a second analog circuit and a second analog-to-digital converter, wherein the input of the second analog circuit is connected to the input of the second circuit, wherein the output of the second analog circuit is connected to the input of the second analog-to-digital converter, wherein the output of the second analog-to-digital converter is connected to the output of the second circuit, wherein the second analog circuit transforms the analog signal via an analog operation on the analog signal and outputs that transformed analog signal at the output of the second analog circuit, and wherein the second analog-to-digital converter digitizes the transformed analog signal input into the second digital signal and outputs the second digital signal at the output of the second analog-to-digital converter.

10. The system as recited in claim 6, wherein the second circuit comprises a second analog-to-digital converter and wherein the second analog-to-digital converter digitizes the inputted analog signal into the second digital signal.

* * * * *

UNITED STATES PATENT AND TRADEMARK OFFICE
CERTIFICATE OF CORRECTION

PATENT NO. : 6,825,789 B1
DATED : November 30, 2004
INVENTOR(S) : Brian Stewart and Ronald L. Swerlein It is certified that error appears in the above-identified patent and that said Letters Patent is hereby corrected as shown below:

Column 9,
Line 10, after "$H_1(f)$", delete "Ds" and insert therefor -- $D_s$ --
Line 11, after "140;", delete "$D_s$" and insert therefor -- $D_1$ --

Signed and Sealed this

Twenty-sixth Day of April, 2005

JON W. DUDAS
*Director of the United States Patent and Trademark Office*